(12) United States Patent
Zhang et al.

(10) Patent No.: US 9,124,078 B2
(45) Date of Patent: Sep. 1, 2015

(54) METER SOCKET BLOCK ASSEMBLY

(71) Applicants: Fan Zhang, Suwanee, GA (US); Brian J. Rusch, Suwanee, GA (US)

(72) Inventors: Fan Zhang, Suwanee, GA (US); Brian J. Rusch, Suwanee, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 279 days.

(21) Appl. No.: 13/856,482

(22) Filed: Apr. 4, 2013

(65) Prior Publication Data
US 2013/0273772 A1    Oct. 17, 2013

Related U.S. Application Data

(60) Provisional application No. 61/623,166, filed on Apr. 12, 2012.

(51) Int. Cl.
| H01R 4/36 | (2006.01) |
| H02B 1/03 | (2006.01) |
| G01R 11/04 | (2006.01) |

(52) U.S. Cl.
CPC . *H02B 1/03* (2013.01); *G01R 11/04* (2013.01)

(58) Field of Classification Search
CPC .................................. H01R 4/36; H01R 4/363
USPC .......................... 439/814, 793, 810, 517, 640
See application file for complete search history.

(56) References Cited

U.S. PATENT DOCUMENTS

| 4,845,592 A * | 7/1989 | Himes et al. .................. 361/775 |
| 2008/0057797 A1 * | 3/2008 | Siglock et al. ................ 439/816 |

* cited by examiner

*Primary Examiner* — Phuongchi T Nguyen

(57) ABSTRACT

A meter socket block assembly for a meter socket connected to a meter having at least one meter blade, wherein the meter socket includes at least one conductor. The meter socket block assembly includes at least one lug and jaw body, the body having a lug portion and a first jaw portion which are unistructurally formed and wherein the lug portion is connected to the conductor. The meter socket block assembly also includes a second jaw portion attached to the first jaw portion to form a jaw for connecting to the meter blade. Further, the meter socket block assembly includes a base having a lug cavity for receiving the body and at least one snap tab for attaching the body to the base.

17 Claims, 8 Drawing Sheets

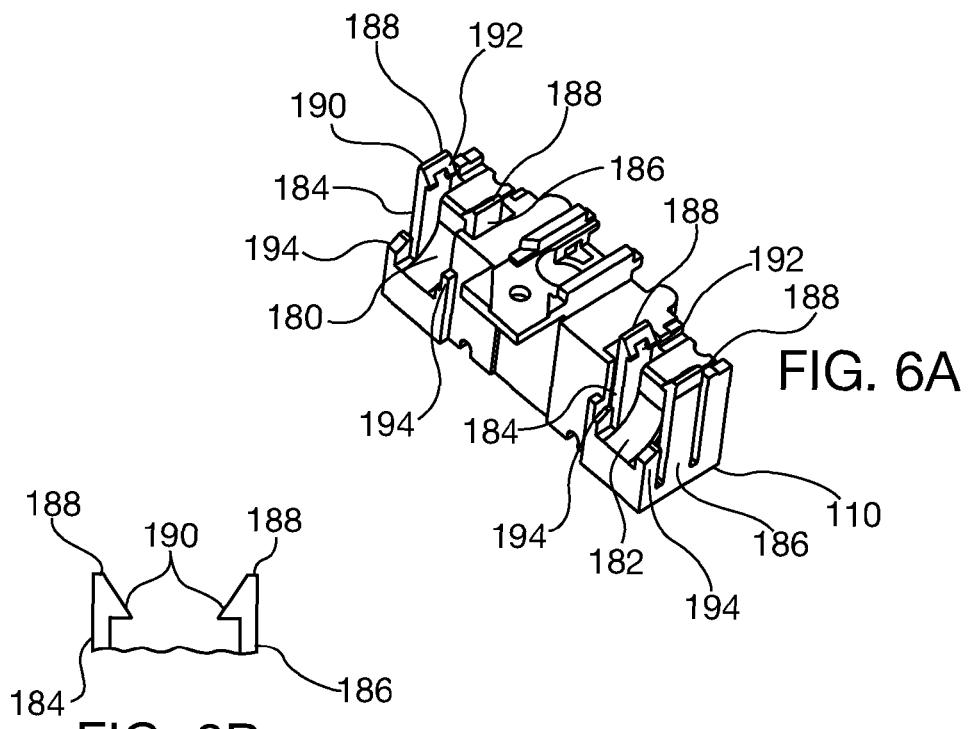
FIG. 6A
FIG. 6B
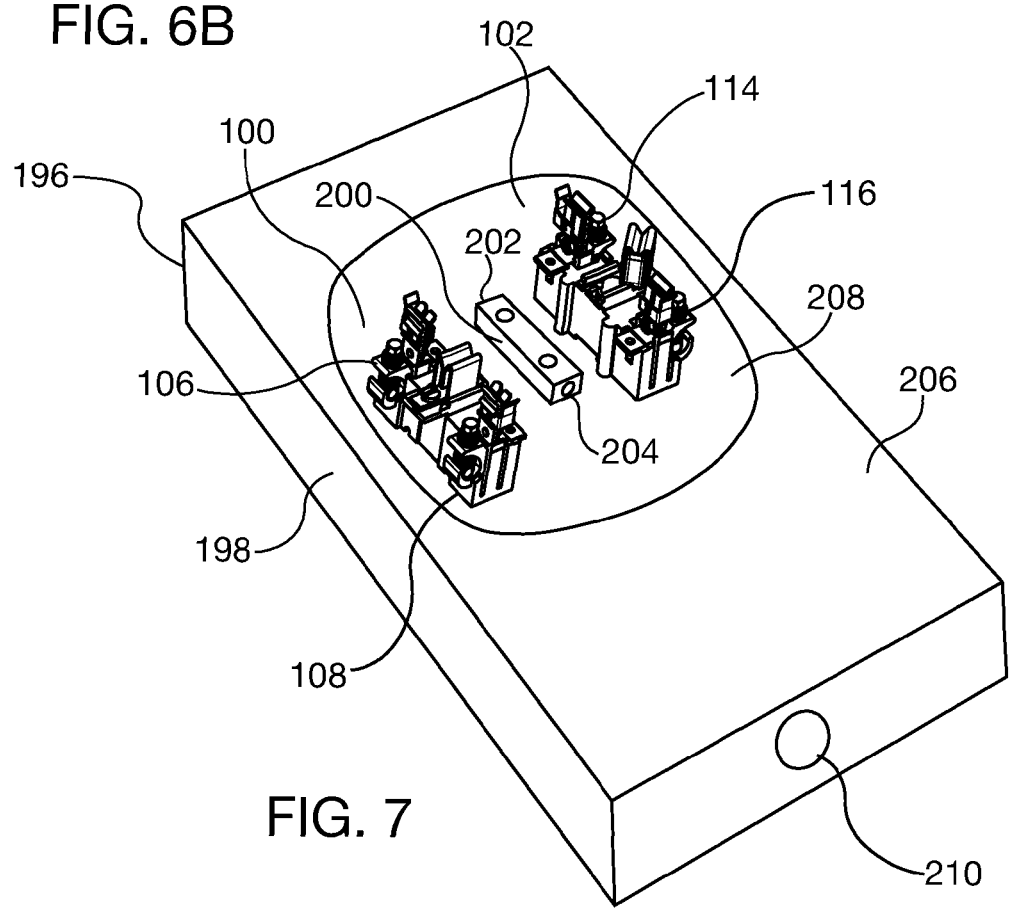
FIG. 7

METER SOCKET BLOCK ASSEMBLY

CROSS REFERENCE TO RELATED APPLICATION

This application claims the benefit under 35 U.S.C. §119(e) of U.S. Provisional Application No. 61/623,166 entitled METER SOCKET FEATURING SNAP-IN ONE PIECE LUG AND JAW BODY WITH SUPPLEMENTAL METER JAW AND SPRING, filed on Apr. 12, 2012 which is incorporated herein by reference in its entirety and to which this application claims the benefit of priority.

FIELD OF THE INVENTION

This invention relates to a meter socket block assembly and more particularly, to a meter socket block assembly having a unistructurally formed lug and jaw body.

BACKGROUND OF THE INVENTION

Electrical power enters a building, such as a residence, through a metering device. The metering device is used to determine how much electricity has been consumed in the building for billing purposes, for example. The metering device includes a meter, such as watt-hour meter, having outwardly extending stabs or blades that are removably connected to a meter socket having jaws for receiving the blades. The meter socket may be connected to a main circuit breaker via conductors and a base pan assembly. The main circuit breaker serves to connect or disconnect electrical power to the building.

Referring to FIG. 1A, a metering device such as a watt-hour meter 10 is shown attached to a meter socket 12. The meter socket 12 includes an enclosure 15 having a front panel 17 that includes an opening for receiving the meter 10. The enclosure 15 may be attached to an outside wall of a building, for example.

Referring to FIG. 1B, the meter socket 12 is shown with the front panel 17 removed to depict an interior 14 of the enclosure 15. Line side conductors for supplying electrical power from a power distribution system to the building may enter the enclosure 15 through a top opening 18. Load side conductors may exit the enclosure 15 through lower openings 19. The meter socket 12 may include horn bypass tabs 16. In use, jumpers are attached to the bypass tabs 16 in order to provide uninterrupted electrical service to a building when the meter 10 is removed from the meter socket 12 to perform maintenance work, for example. The meter socket 12 may also include a shield 20 for shielding components and a meter seat wireform support 22.

Referring to FIG. 1C, the meter socket 12 is shown with the shield 20 removed. The meter socket 12 includes left 24 and right 26 meter socket block assemblies and a neutral lug 25 having upper 31 and lower 33 terminals. Each upper jaw 28 is connected to a corresponding line side conductor and the upper terminal 31 is connected to a line side neutral conductor. Each lower jaw 29 is connected to a corresponding load side conductor and the lower terminal 33 is connected to a load side neutral conductor. The upper 28 and lower 29 jaws are configured to receive blades that extend from a back surface of the meter 10. The right meter socket block assembly 26 also includes a jaw stand 30 oriented at a 45° angle. The 45° jaw stand 30 is used to rest an idling watt-hour meter 10 that is out of service. In particular, the left 24 and right 26 meter socket block assemblies are configured such that when a meter blade is inserted in the 45° jaw stand 30, the remaining meter blades are disengaged. The left meter socket block assembly 24 may also include an optional jaw known as a $5^{th}$ jaw 32 used in conjunction with electrical systems using a three phase "Y" transformer. In particular, the $5^{th}$ jaw 32 is connected to neutral to detect a voltage reference used to calculate electrical consumption.

In conventional meter sockets, an electrical connection between a jaw and lug becomes loose or deteriorates over time which may cause undesirable overheating, fire or other danger. Further, the assembly of conventional jaws and lugs requires several components that are relatively complex to manufacture and assemble, thus increasing costs. Thus, it is desirable to provide an improved jaw and lug configuration for a meter socket.

SUMMARY OF THE INVENTION

A meter socket block assembly is disclosed for a meter socket connected to a meter having at least one meter blade, wherein the meter socket includes at least one conductor. The meter socket block assembly includes at least one lug and jaw body, the body having a lug portion and a first jaw portion which are unistructurally formed and wherein the lug portion is connected to the conductor. The meter socket block assembly also includes a second jaw portion attached to the first jaw portion to form a jaw for connecting to the meter blade. Further, the meter socket block assembly includes a base having a lug cavity for receiving the body and at least one snap tab for attaching the body to the base.

BRIEF DESCRIPTION OF THE DRAWINGS

FIGS. 6A and 6B depict perspective and partial side views, respectively, of a first meter socket base.
FIG. 7 depicts a meter socket including the first and second meter socket block assemblies in accordance with the present invention.

DESCRIPTION OF THE INVENTION

Figure 1A:
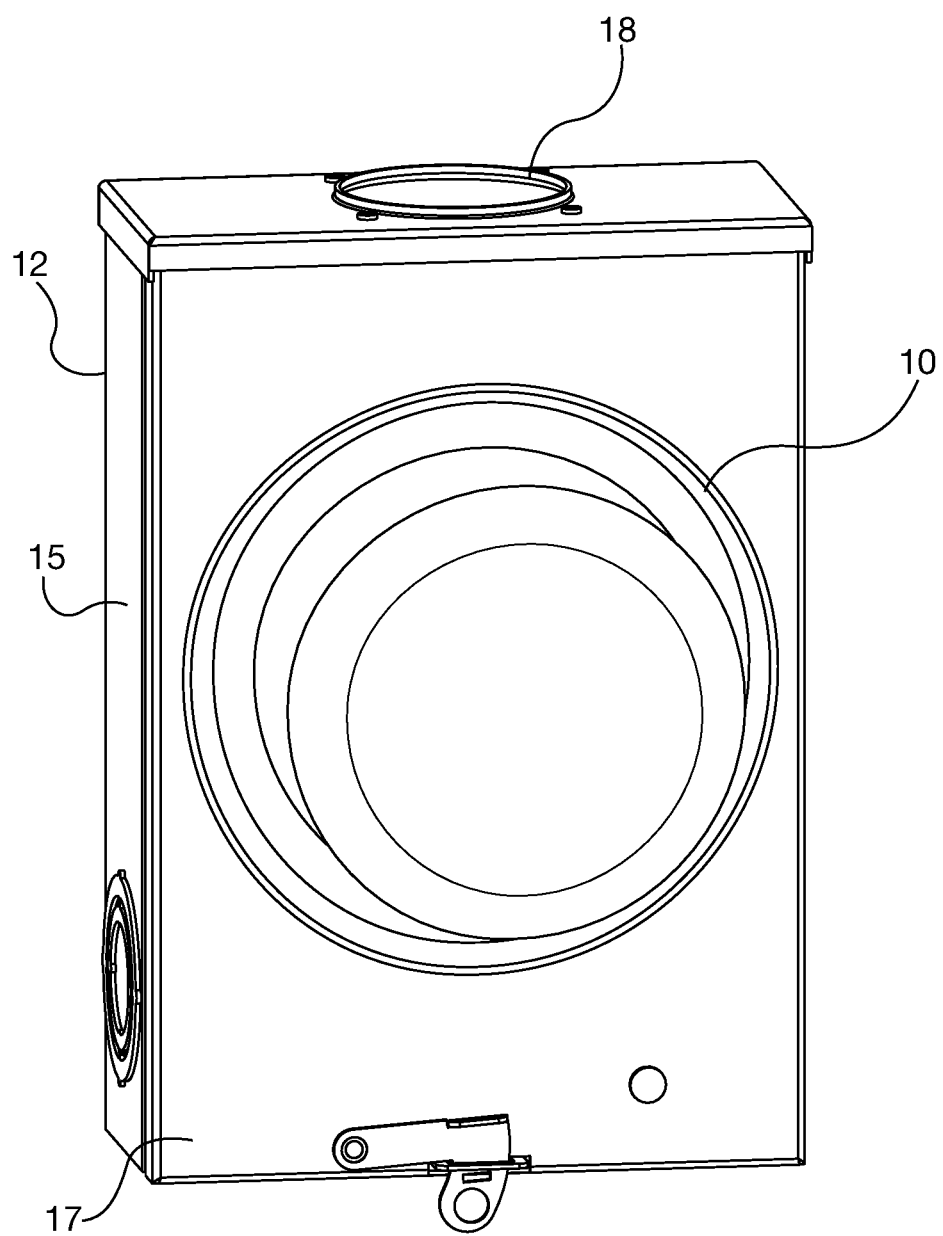
FIGS. 1A-1C depict views of a conventional meter socket.
Figure 1B:
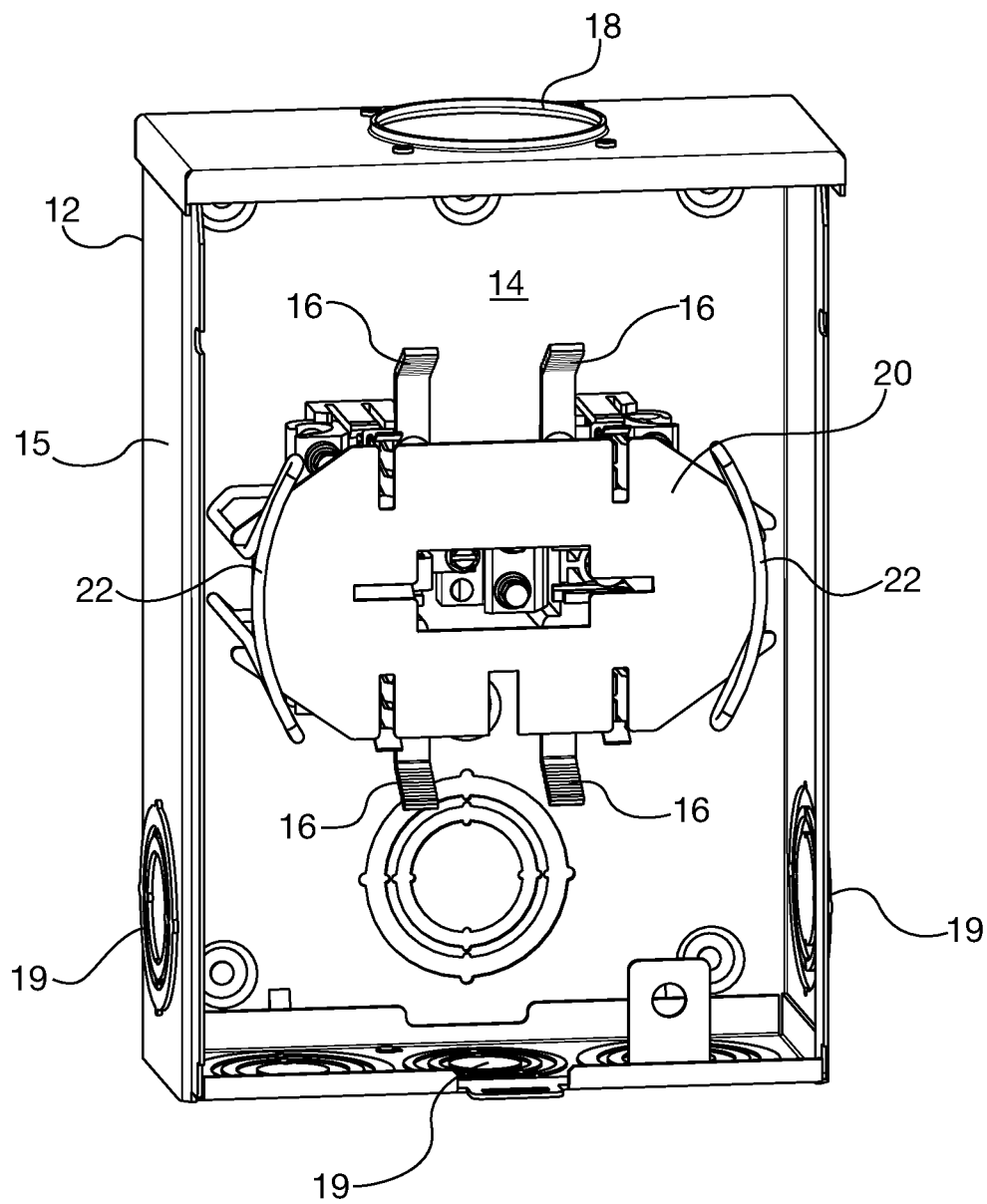
Figure 1C:
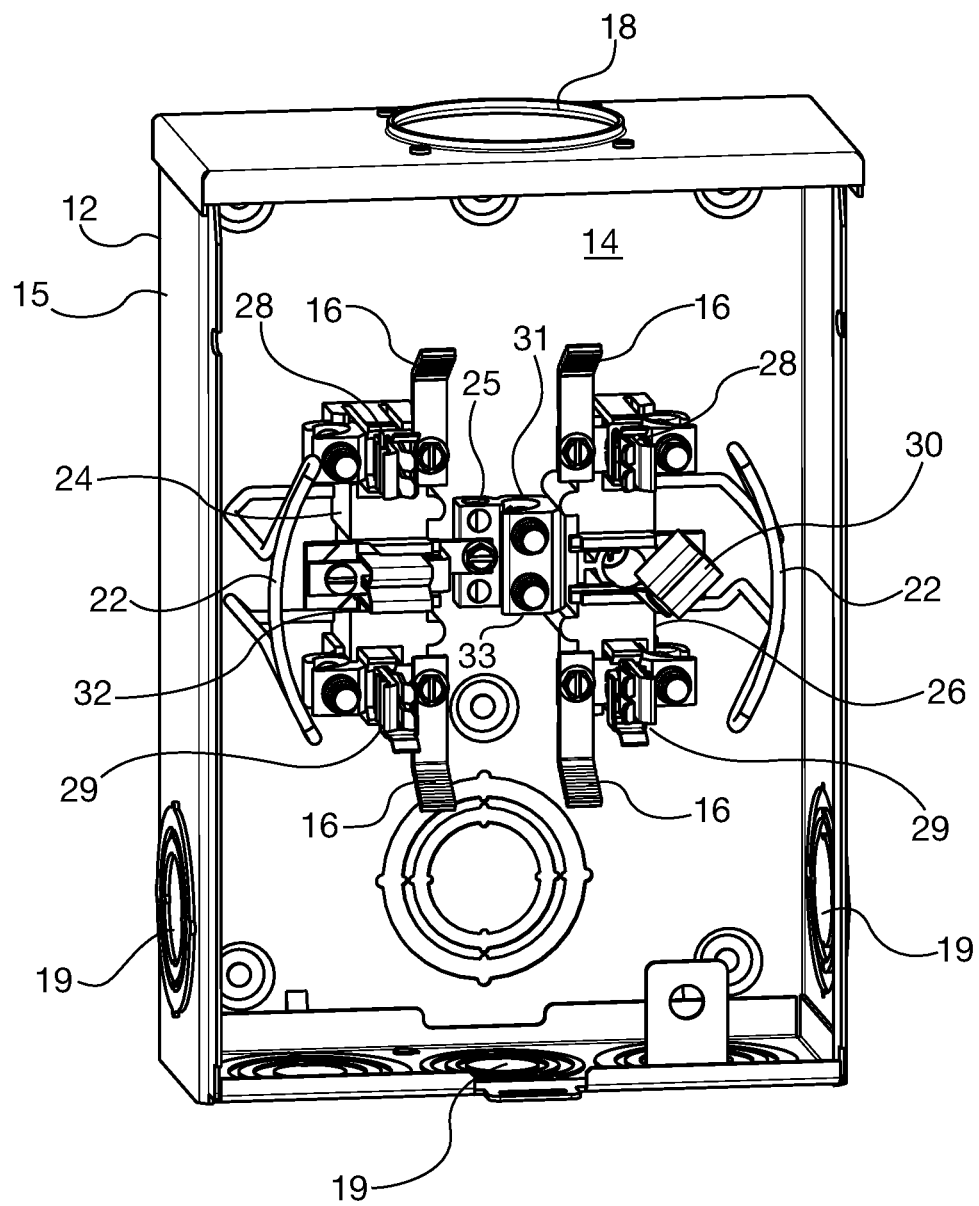

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings. In the description below, like reference numerals and labels are used to describe the same, similar or corresponding parts in the several views of FIGS. 1-7.

Figure 2:
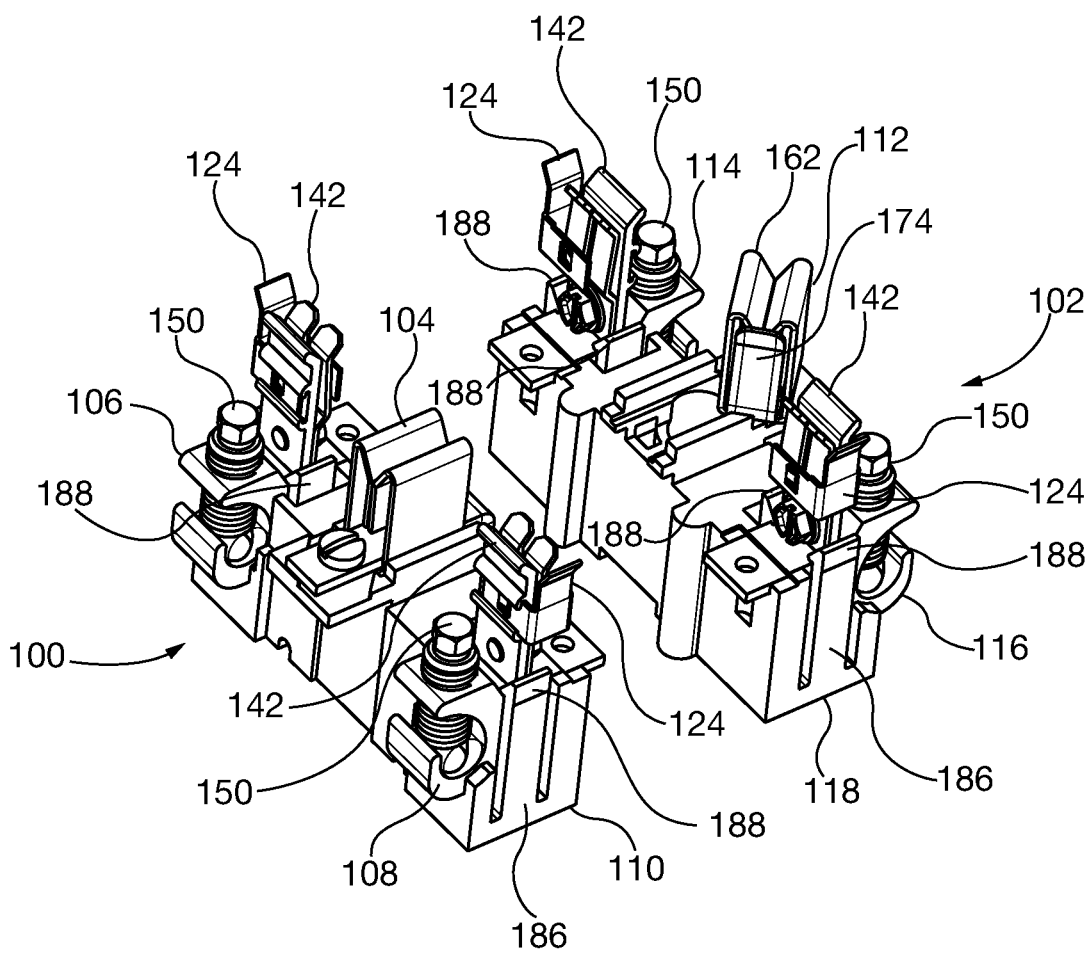
FIG. 2 depicts views of first and second meter socket block assemblies for use in an enclosure for a meter socket.

Referring to FIG. 2, first 100 and second 102 meter socket block assemblies for use in an enclosure for a meter socket are shown. The first meter socket block assembly 100 includes a $5^{th}$ terminal or $5^{th}$ jaw 104 located between a first lug and jaw element 106 and a second lug and jaw element 108. The $5^{th}$ jaw 104 is used in conjunction with systems using a three phase "Y" transformer. In particular, the $5^{th}$ jaw 32 is connected to neutral to detect a voltage reference used to calculate electrical consumption. The first and second lug and jaw elements 106, 108 and $5^{th}$ jaw 104 are attached to a first meter socket base 110 as will be described. The second meter socket block assembly 102 includes a 45° jaw stand 112 located between third 114 and fourth 116 lug and jaw elements. The 45° jaw stand 112 is used for resting a watt-hour meter when out of service. In particular, the meter socket is configured such that when a meter blade is inserted in the 45° jaw stand 112, the remaining meter blades are disengaged. The third 114 and fourth 116 lug and jaw elements and 45° jaw stand 112 are attached to a second meter socket base 118. The first 110 and second 116 meter socket bases may be fabricated from a material that is an electrical insulator which also has resilient properties such as plastic.

Figure 3:
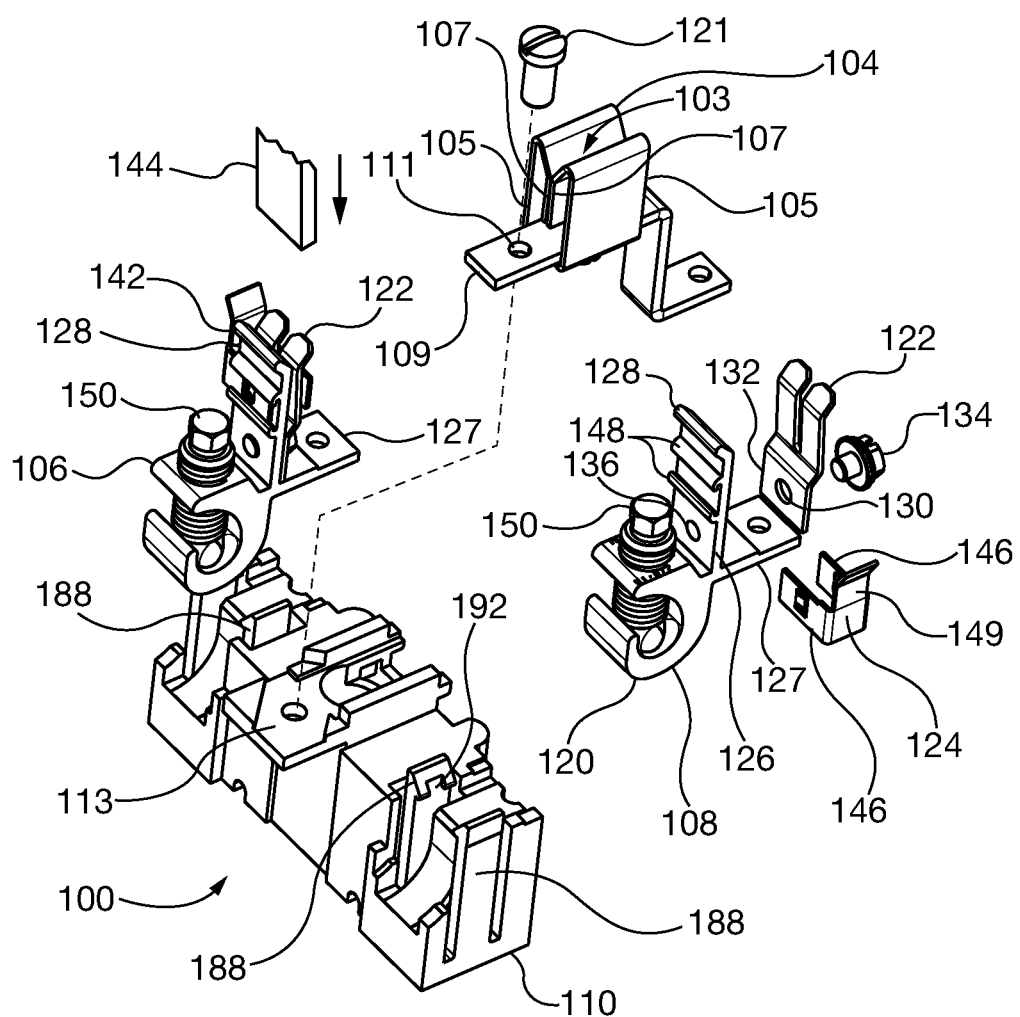
FIG. 3 is an exemplary partial exploded view of the first meter socket block assembly and a second lug and jaw element.

Referring to FIG. 3, an exemplary partial exploded view of the first meter socket block assembly 100 and second lug and jaw element 108 is shown. In accordance with the invention, the following description of the first meter socket block assembly 100 and the first and second lug and jaw elements 106, 108 is also applicable to the second meter socket block assembly 102 and the third 114 and fourth 116 lug and jaw elements. The $5^{th}$ jaw 104 includes side walls 105 each including a downwardly extending contact surface 107 which are spaced apart to form a first jaw gap 103 for receiving a meter blade. The $5^{th}$ jaw 104 includes an outwardly extending first member 109 having a through hole 111. A fastener 121 extends through the hole 111 and is threadably engaged with a threaded hole 113 in the first meter socket base 110 to attach the $5^{th}$ jaw 104 to the first meter socket base 110. Alternatively, the $5^{th}$ jaw 104 may also be attached with other types of fasteners such as a rivet or other types of fastening arrangements such as being snapped in to the first meter socket base 110 or by using an adhesive.

The second lug and jaw element 108 includes a lug and jaw body 120 having an upstanding wall 126 and a second member 127 that is oriented transverse to the wall 126 to form a substantially L-shaped configuration. The lug and jaw body 120 is integrally formed as a one piece, or unistructural, configuration. In addition, the wall 126 is located between first 129 and second 131 captive sections formed on the second member 127 (see FIG. 4A). The wall 126 includes a first jaw half element 128. The lug and jaw body 120 also includes a separate second jaw half element 122 having a downwardly extending third member 132 that includes a through hole 130. The first jaw half element 122 is attached to the lug and jaw body 120 by a fastener 134 that extends through the hole 130 and is threadably engaged with a threaded hole 136 in the wall 126 to form a full jaw 142. Alternatively, the first 128 and second 122 half elements may be secured by a rivet or an adhesive. The lug and jaw body 120 including first jaw half element 128 and second jaw half element are fabricated from a suitable material such as copper.

In use, a meter blade 144 is received between the first 128 and second 122 jaw half elements to establish electrical contact between the meter blade and the first 128 and second 122 jaw half elements The first 128 and second 122 jaw half elements are fabricated from a resilient material and are configured to be biased against the meter blade 144 to maintain electrical contact. The lug and jaw body 120 may also include a jaw guide 124 having spaced apart arms 146 that extend from a first guide section 149. The first 128 and second 122 jaw half elements are located between the arms 146. The first guide section 149 is oriented in a direction transverse to the arms 146 and serves to guide the meter blade 144 during insertion of the meter blade 144 between the first 128 and second 122 jaw half elements.

Figure 4A:
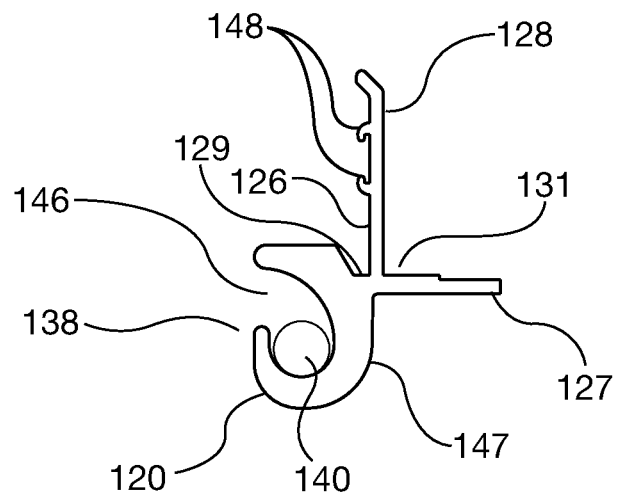
FIGS. 4A and 4B depict a unistructural lug and jaw body.
Figure 4B:
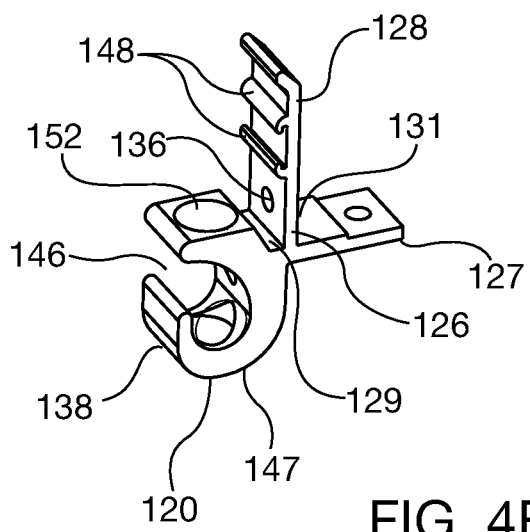

Referring to FIGS. 4A and 4B, the lug and jaw body 120 further includes a lug portion 147 having a first aperture 146 for forming wire terminal 138 that is shaped to accept a conductor 140. The lug and jaw body 120 also includes a threaded hole 152 for threadably engaging a wire binding screw 150. The conductor 140 is secured against the lug and jaw body 120 by the screw 150. The wall 126 further includes spaced apart ridges 148 for receiving an arm 146 of the jaw guide 124. The ridges 148 serve to guide insertion of the arm 146 and thus jaw guide 124 over the first 128 and second 122 jaw half elements.

Figure 5A:
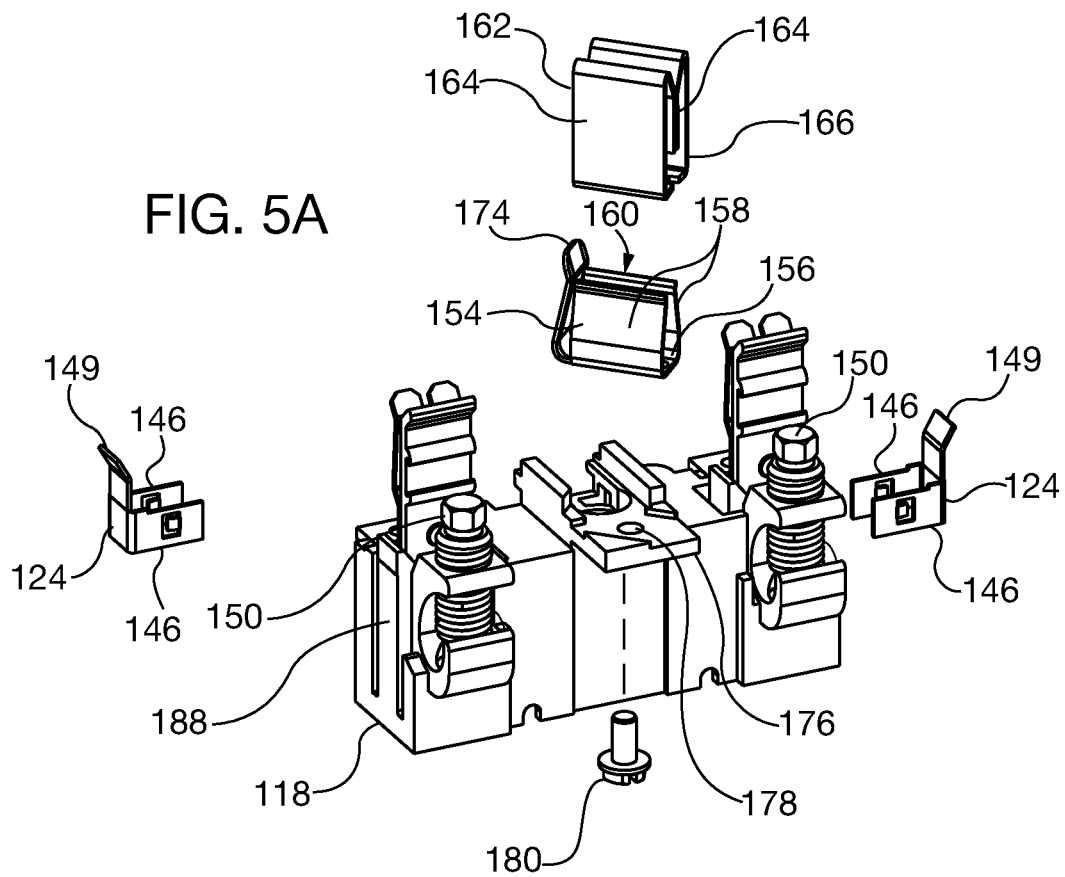
FIGS. 5A and 5B depict exploded and assembled views, respectively, of a 45° jaw stand.
Figure 5B:
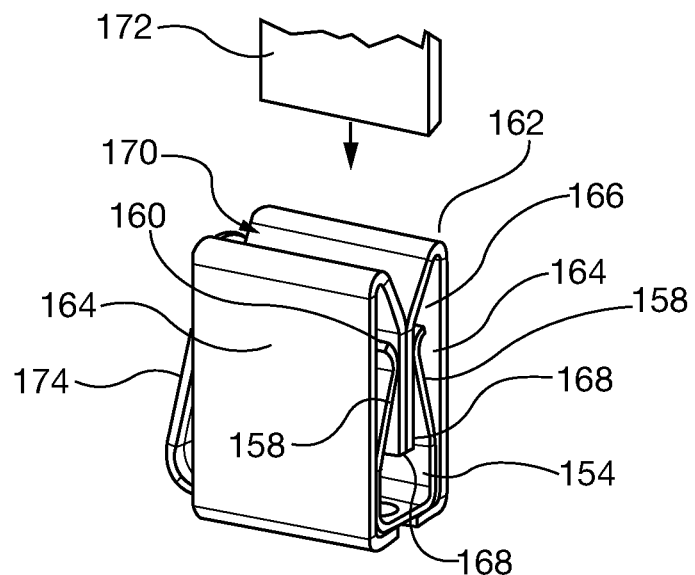

Referring to FIGS. 5A and 5B, exploded and assembled views, respectively, of the 45° jaw stand 112 are shown. The 45° jaw stand 112 includes an inner portion 154 having a center section 156 located between spaced apart spring fingers 158 forming a finger gap 160. The 45° jaw stand 112 also includes an outer portion 162 having side walls 164 forming a cavity 166. The side walls 164 each include a downwardly extending contact surface 168 to form a second jaw gap 170 for receiving a meter blade 172. The inner 154 and outer 162 portions are fabricated from a resilient material. The inner portion 154 is inserted into the cavity 166 such that the contact surfaces 168 are located within the finger gap 160 and between the spring fingers 158. When installed, the meter blade 172 is positioned between the contact surfaces 168. The spring fingers 158 are biased to urge the contact surfaces 168 toward the meter blade 172 thus retaining the meter blade 172. The center section 156 further includes an upstanding second guide section 174 which is located adjacent an end of the spring fingers 58. The second guide section 174 serves to guide the meter blade 172 during insertion of the meter blade 172 between the contact surfaces 168. The second meter socket base 118 includes an outwardly extending fourth member 176 having a through hole 178. A fastener 180 extends through the hole 178 and is threadably engaged with a threaded hole in the inner portion 154 to attach the 45° jaw stand 112 to the second meter socket base 118.

Referring to FIG. 6, a perspective view of the first meter socket base 110 is shown. The first meter socket base 110 includes first 180 and second 182 lug cavities for receiving the first and second lug and jaw elements 106, 108. Each lug cavity 180,182 is located between upstanding first 184 and second 186 arms that extend from the first meter socket base 110 in a first position. Alternatively, one arm located adjacent a cavity 180,182 may be used. Referring to FIG. 6A, a partial side view of the first 184 and second 186 arms is shown. The first 184 and second 186 arms each include a snap tab 188 having a hook or projection portion 190. Each projection portion 190 is adapted to contact a top surface of the first 129 and second 131 sections of the second member 127 (see FIGS. 4A and 4B). This restrains movement of the second member 127 and attaches first lug and jaw element 106, for example, to the first meter socket base 110. Referring to FIG. 6 in conjunction with FIG. 6A, each projection portion 190 includes a cutout 192. Each cutout 192 receives wall 126 and third member 132 of full jaw 142 (see FIG. 3) and serves to align the first lug and jaw element 106 with respect to the lug cavity 180. The first 184 and second 186 arms are fabricated from a resilient material.

The first lug and jaw element 106 may be attached to the first meter socket base 110 by aligning the wall 126 and third member 132 of full jaw 142 with cutouts 192. The first lug and jaw element 106 is then lowered until contact is made between the lug and jaw element 106 and the projection portions 190. This causes the first 184 and second 186 arms to deflect, thus moving the projection portions 190 away from each other. As the first lug and jaw element continues to be lowered, the first 184 and second 186 arms then snap back to the first position once the wall 126 and third member 132 are located within a respective cutout. In this position, the projection portions 190 are located on the top surface of the first 129 and second 131 sections (see FIGS. 4A and 4B), thus capturing the first lug and jaw element 106 within the lug cavity 180. Thus, the current invention provides a lug and jaw element that can be simply snapped onto a meter socket base. In addition, the first meter socket base includes a lug guide 194 formed on a periphery of each lug cavity 180,182 which serves to inhibit movement of first lug and jaw element 106 during wiring and torqueing operations.

Referring to FIG. 7, a meter socket 196 in accordance with the present invention is shown. The meter socket 196 includes an enclosure 198 for housing the first 100 and second 102 meter socket block assemblies as previously described and a neutral lug 200 having upper 202 and lower 204 terminals. The enclosure 198 includes a front panel 206 having an opening 208 for receiving a metering device, such as watt-hour meter, used to determine how much electricity has been consumed in a building for billing purposes, for example. The meter socket 196 may be connected to a main circuit breaker via conductors and a base pan assembly. The enclosure 198 may be attached to an outside wall of a building, for example. Line side conductors for supplying electrical power from a power distribution system to the building and a line side neutral conductor may enter the enclosure 198 through a top opening. The first lug and jaw element 106 and third lug and jaw element 114 are each connected to a corresponding line side conductor and the upper terminal 202 is connected to the line side neutral conductor. The second lug and jaw element 108 and fourth lug and jaw element 116 are each connected to a corresponding load side conductor and the lower terminal 204 is connected to a load side neutral conductor. Load side conductors may exit the enclosure 198 through lower opening 210.

The current invention provides an improved jaw and lug configuration which has improved reliability and performance, requires fewer components, has reduced manufacturing costs and is relatively easy to assemble. In addition, the disclosure of U.S. Pat. No. 7,614,908 issued on Nov. 10, 2009 and entitled INSULATED METER JAW GUIDE FOR A WATT-HOUR METER SOCKET is incorporated herein by reference in its entirety. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations.

What is claimed is:

1. A meter socket block assembly for a meter socket connected to a meter having at least one meter blade, wherein the meter socket includes at least one conductor, comprising:
    at least one lug and jaw body, the body having a lug portion and a first jaw portion which are integrally formed in one piece and wherein the lug portion is connected to the conductor;
    a second jaw portion attached to the first jaw portion to form a jaw for connecting to the meter blade;
    a jaw guide for guiding insertion of the meter blade,
        wherein the first jaw portion includes a wall having ridges configured to receive the jaw guide therebetween and to guide the jaw guide in surrounding relation around the first and second jaw portions; and
    a base for supporting the jaw and lug body.

2. The meter socket block assembly according to claim 1, wherein the second jaw portion is connected to the first jaw portion via a fastener.

3. The meter socket block according to claim 1, wherein the jaw receives a first meter blade, further including a jaw stand and a further jaw that receives a second meter blade, wherein the first meter blade has an inserting direction into the jaw that is at an angle of 45° relative to an inserting direction into the further jaw of the second meter blade.

4. The meter socket block according to claim 1, further including a further jaw.

5. A meter socket block assembly for a meter socket connected to a meter having at least one meter blade, wherein the meter socket includes at least one conductor, comprising:
    at least one lug and jaw body, the body having a lug portion and a first jaw portion which are integrally formed in one piece and wherein the lug portion is connected to the conductor;
    a second jaw portion attached to the first jaw portion to form a jaw for connecting to the meter blade;
    a jaw guide for guiding insertion of the meter blade,
        wherein the first jaw portion includes a wall having ridges configured to receive the jaw guide therebetween and to guide the jaw guide in surrounding relation around the first and second jaw portions;
    a base having a lug cavity for receiving the body; and
    at least one snap tab for attaching the body to the base.

6. The meter socket block assembly according to claim 5, wherein the second jaw portion is connected to the first jaw portion via a fastener.

7. The meter socket block according to claim 5, wherein the jaw receives a first meter blade, further including a jaw stand and a further jaw that receives a second meter blade, wherein the first meter blade has an inserting direction into the jaw that is at an angle of 45° relative to an inserting direction into the further jaw of the second meter blade.

8. The meter socket block according to claim 5, further including a further jaw.

9. The meter socket block according to claim 5, wherein the snap tab includes a cutout for receiving a portion of the jaw.

10. The meter socket block according to claim 5, wherein the snap tab includes an arm located adjacent the lug cavity.

11. The meter socket block according to claim 5, wherein the snap tab includes a projection portion which captures sections of the lug and jaw body adjacent the first jaw portion.

12. A meter socket for connection to a meter having at least one meter blade, wherein the meter socket includes at least one conductor, comprising:
    an enclosure having an opening for receiving the meter;
    at least one meter socket block assembly located in the enclosure, the meter socket block assembly including at least one lug and jaw body, the body having a lug portion and a first jaw portion which are integrally formed in one piece and wherein the lug portion is connected to the conductor;

a second jaw portion attached to the first jaw portion to form a jaw for connecting to the meter blade;
a jaw guide for guiding insertion of the meter blade, wherein the first jaw portion includes a wall having ridges configured to receive the jaw guide therebetween and to guide the jaw guide in surrounding relation around the first and second jaw portions;
a base having a lug cavity for receiving the body; and
at least one snap tab for attaching the body to the base.

13. The meter socket block assembly according to claim 12, wherein the second jaw portion is connected to the first jaw portion via a fastener.

14. The meter socket block according to claim 12, wherein the jaw receives a first meter blade, further including a jaw stand and a further jaw that receives a second meter blade, wherein the first meter blade has an inserting direction into the jaw that is at an angle of 45° relative to an inserting direction into the further jaw of the second meter blade.

15. The meter socket block according to claim 12, further including a further jaw.

16. The meter socket block according to claim 12, wherein the snap tab includes a cutout for receiving a portion of the jaw.

17. The meter socket block according to claim 12, wherein the snap tab includes an arm located adjacent the lug cavity.

* * * * *